(12) United States Patent
Kato et al.

(10) Patent No.: US 6,333,715 B1
(45) Date of Patent: Dec. 25, 2001

(54) PARTIAL DISCHARGE DETECTOR OF GAS-INSULATED APPARATUS

(75) Inventors: Tatsuro Kato, Hitachi; Youichi Ohshita, Hitachinaka, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/424,152

(22) PCT Filed: May 21, 1997

(86) PCT No.: PCT/JP97/01707

§ 371 Date: Nov. 19, 1999

§ 102(e) Date: Nov. 19, 1999

(87) PCT Pub. No.: WO98/53334

PCT Pub. Date: Nov. 26, 1998

(51) Int. Cl.$^7$ ..................................................... H01Q 1/26
(52) U.S. Cl. ........................................... 343/701; 324/536
(58) Field of Search ............................. 343/701; 324/72, 324/536

(56) References Cited

U.S. PATENT DOCUMENTS

| 4,277,746 | * | 7/1981 | Abe et al. ............................ 324/72 |
| 5,214,595 | * | 5/1993 | Ozawa et al. ................... 364/551.01 |
| 5,804,972 | | 9/1998 | de Kock et al. ..................... 324/536 |

FOREIGN PATENT DOCUMENTS

| 134 187 | 3/1985 | (EP) . |
| 699 918 | 3/1996 | (EP) . |
| 706 056 | 4/1996 | (EP) . |
| 730160A2 | 9/1996 | (EP) . |
| 780 692 | 6/1997 | (EP) . |
| 55-117409 | 9/1980 | (JP) . |
| 62-134574 | 6/1987 | (JP) . |
| 62-93777 | 6/1987 | (JP) . |
| 3-56016 | 3/1991 | (JP) . |
| 3-164023 | 7/1991 | (JP) . |
| 06235749 | 8/1994 | (JP) . |
| 7-301657 | 11/1995 | (JP) . |
| 8-136605 | 5/1996 | (JP) . |
| 8-248065 | 9/1996 | (JP) . |
| 8-271574 | 10/1996 | (JP) . |

OTHER PUBLICATIONS

M.D. Judd et al, "Broadband Couplers for UHF Detection of Partial Discharge in Gas–Insulated Substations," IEEE Proc. Sci. Meas. Technol., vol. 142, No. 3, May 1995, pp. 237–243.

* cited by examiner

Primary Examiner—Don Wong
Assistant Examiner—Shih-Chao Chen
(74) Attorney, Agent, or Firm—Mattingly, Stanger & Malur, P.C.

(57) ABSTRACT

With a circular signal receiving antenna unit (4) constituted by combining two pieces of semicircular conductive plates on a plane in a metallic vessel (3) for the gas insulated apparatus, the electromagnetic waves due to the partial discharge can be detected with a high sensitivity for a broad frequency band. The detected signals are measured by a measuring unit (10) via a hermetical seal coaxial terminal (7) and a coaxial cable (8). The antenna portions of the semicircular plates are designed to extend over a large area. Thus, a capacitance with a potential measurement portion can be increased and a potential measurement with high sensitivity can be performed.

11 Claims, 5 Drawing Sheets

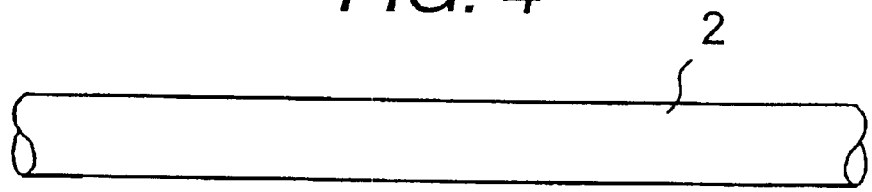
FIG. 4
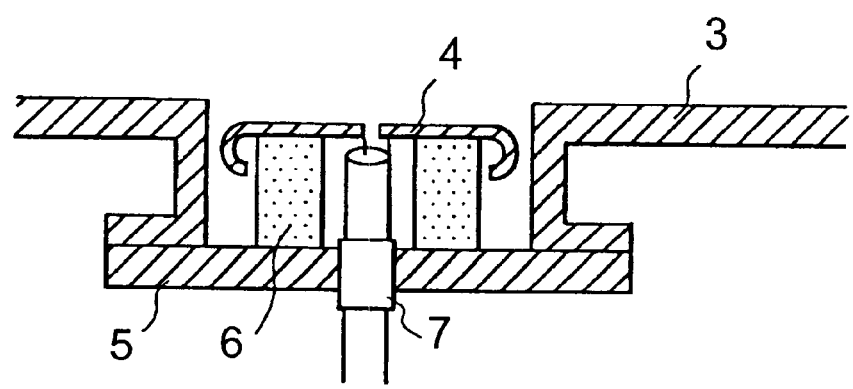
FIG. 5
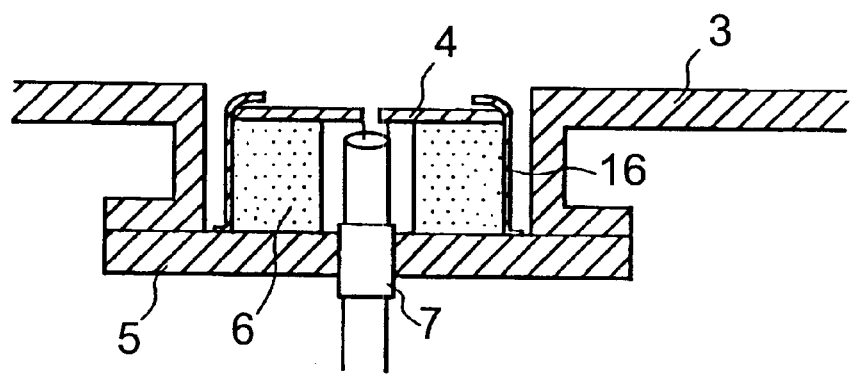

PARTIAL DISCHARGE DETECTOR OF GAS-INSULATED APPARATUS

FIELD OF THE INVENTION

The present invention relates to a partial discharge detector for a gas insulated apparatus, in particular, to a partial discharge detector suitable for detecting occurrence of a partial discharge representing insulation abnormality in an insulating gas filled metallic vessel from the outside of the metallic vessel for a gas insulated apparatus such as a gas insulated circuit breaker, a gas insulated switch gear and a gas insulated bus bar.

BACKGROUND OF THE INVENTION

Electric power devices used in a substation include, such as a gas insulated circuit breaker, a gas insulated switch gear, a gas insulated bus bar, a gas insulated transformer and the like. These electrical power devices are gas insulated apparatuses which include a high voltage conductor or conductors supported by insulation members accommodated in a hermetically sealed metallic vessel filled with insulation gas.

In such a gas insulated apparatus, if an internal defect such as a metallic extraneous substance exists inside the metallic vessel, the intensity of the electric field inside the vessel becomes very high locally, and a partial discharge may occur therein. Such partial discharge may result in a dielectric breakdown, if its occurrence is left as it is. Further, there is a fear that such dielectric breakdown finally causes a serious accident. Accordingly, it is necessary to take some countermeasures by detecting these partial discharges occurring in the metallic vessel at the early stage thereof, and it was known that a possible dielectric breakdown can be predicted in advance by detecting the partial discharge signals, and the partial discharge detection was considered important as a method of preventive maintenance of such gas insulated apparatuses.

The partial discharge occurring in an atmosphere of $SF_6$ gas generates a current in a sharp pulse form, whereby electromagnetic waves induced by the partial discharge are radiated in a moment in a space inside the metallic vessel and are propagated inside the metallic vessel. Therefore, an insulation abnormality can be predicted by detecting these electromagnetic waves. However, the metallic vessel is hermetically sealed, the electromagnetic waves are scarcely leaked outside the sealed metallic vessel. Accordingly, the following partial discharge detectors for a gas insulated apparatus have been proposed which detect signals inside the sealed metallic vessel and the detected signals are transmitted to an external measurement unit via a sealed terminal, for example, JP-A-3-56016 discloses a provision of a loop antenna inside the metallic vessel for the gas insulated apparatus, and detection by the loop antenna of the radiated electromagnetic waves induced by the generated partial discharge, and further, JP-A-3-164023 discloses, a method of detecting the electromagnetic waves radiated with a slot antenna from outside the metallic vessel.

Further, in a gas insulated apparatus, it is necessary to carry out a measurement of an operating voltage to investigate whether or not a normal voltage is applied, as well as a measurement of a surge voltage to investigate a surge caused by a lightning or a switching operation of various switches. A conventional gas insulated apparatus was provided with a voltage detector capable of detecting such voltages as mentioned above.

For such a voltage detector provided in a gas insulated apparatus, the detector as disclosed in JP-A-8-248065 has been known so far. The voltage detector is of a non-contact type and detects the voltage by an electrostatic voltage dividing. In the conventional partial discharge detection methods for the gas insulated apparatus as has been explained above, the partial discharge signals were very feeble and were likely to be influenced by external noises. Therefore, the detection sensitivity and accuracy of the partial discharge signals were not necessarily satisfactory, and a highly sensitive partial discharge detection method is desired. Further, since the partial discharge occurring position varies, it is possible that not only the magnitude of the signal varies but also the output with respect to frequencies varies largely. Therefore, in order to locate the partial discharge occurring position a highly sensitive detection is required over a broad frequency band over 0~ to several GHz.

Further, when an accurate voltage measurement was required, the size of the measurement device increases. Therefore, a simple but accurate voltage measurement method is desired.

An object of the present invention is to provide a partial discharge detector for a gas insulated apparatus which shows a high detection sensitivity over a wide range of frequencies.

Another object of the present invention is to provide a partial discharge detector for a gas insulated apparatus which permits measurement of an operating voltage and a surge voltage.

Still another object of the present invention is to provide a partial discharge detector for a gas insulated apparatus which shows a high detection sensitivity over a wide range of frequencies and permits measurement of an operating voltage and a surge voltage.

DISCLOSURE OF THE INVENTION

A partial discharge detector for a gas insulated apparatus having a metallic vessel, which is filled with insulation gas and accommodates therein a high voltage conductor or conductors supported by insulating members according to the present invention which achieves the above objects comprises, a signal receiving antenna unit which is formed by disposing two plate shaped conductive electrodes with a gap in the metallic vessel; a coaxial cable which is coupled to the signal receiving antenna unit and is led out to the outside of the metallic vessel via a hermetically sealed coaxial terminal; and a measuring unit coupled to the coaxial cable. Further, the two plate shaped conductive electrodes are disposed in a low electric field portion such as in an absorbent pocket, a particle trap and a hand hole inside the gas insulated apparatus, and each electrode is formed in a semicircular shape. Still further, between a signal line from the signal receiving antenna unit and the ground a capacitor is inserted. Still further, the two plate shaped conductive electrodes are formed in such a shape which extend along the inner face of the metallic vessel. Still further, external circumferential sharp edge portions of the two plate shaped conductive electrodes are formed rounded. Moreover, a shield electrode is provided to cover the external circumferences of the two plate shaped conductive electrodes.

BRIEF DESCRIPTION OF THE DRAWINGS

FIG. 4 is a partial cross sectional view showing a modification of FIG. 1;

FIG. 5 is a partial cross sectional view showing another modification of FIG. 1;

DETAILED DESCRIPTION OF THE PREFERRED EMBODIMENTS

Figure 1:
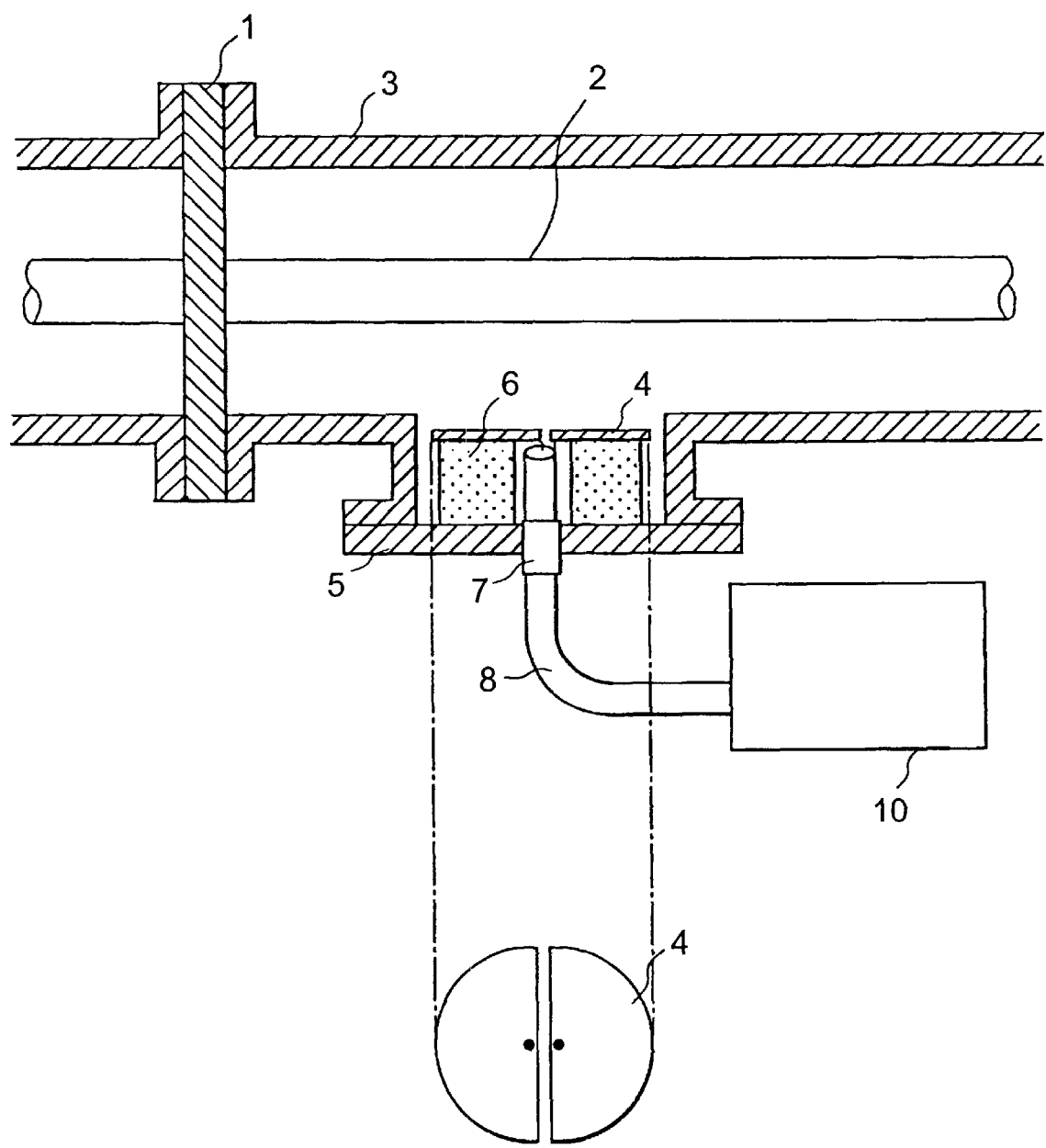
FIG. 1 is a vertical cross sectional view showing a partial discharge detector for a gas insulated apparatus according to an embodiment of the present invention.
Figure 2:
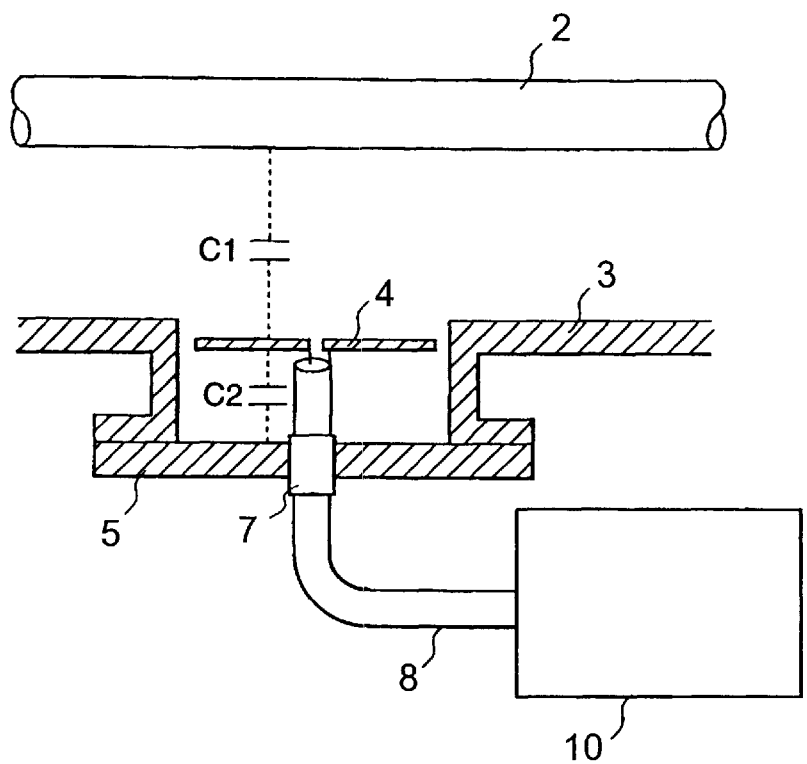
FIG. 2 is a vertical cross sectional view showing an example which is applied for a potential measurement for the gas insulated apparatus.
Figure 3:
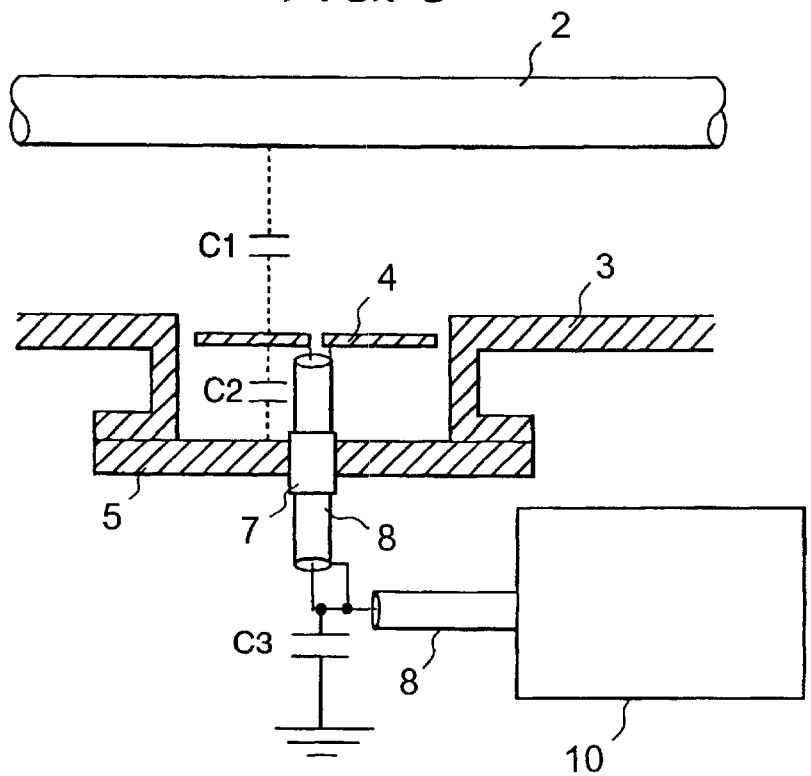
FIG. 3 is a vertical cross sectional view showing a modification of FIG. 2.
Figure 6:
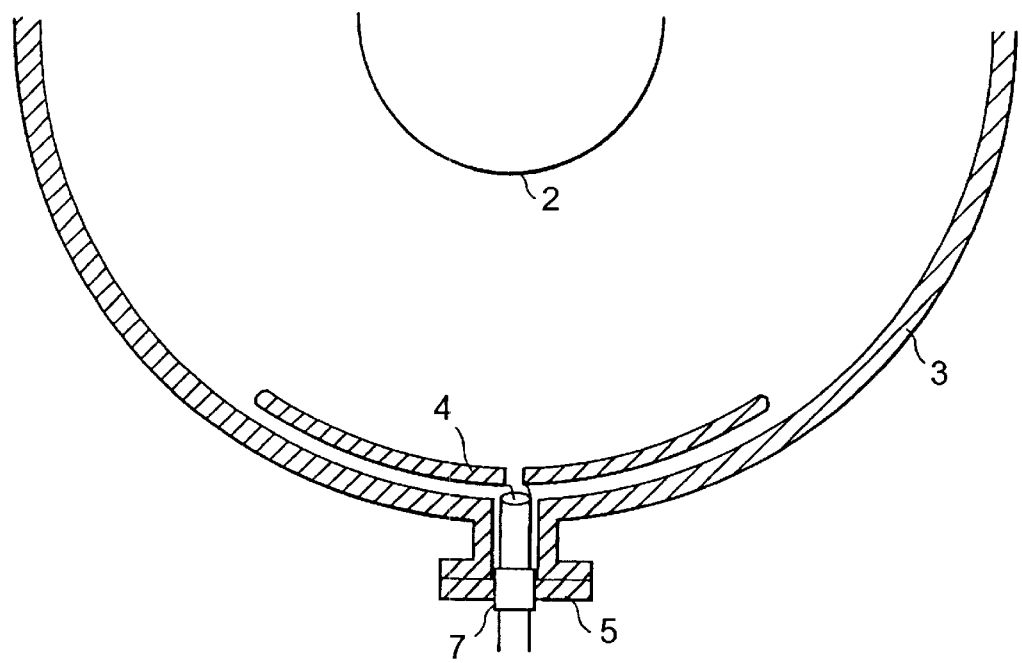
FIG. 6 is a vertical cross sectional view showing a modification of a signal receiving antenna unit.
Figure 8:
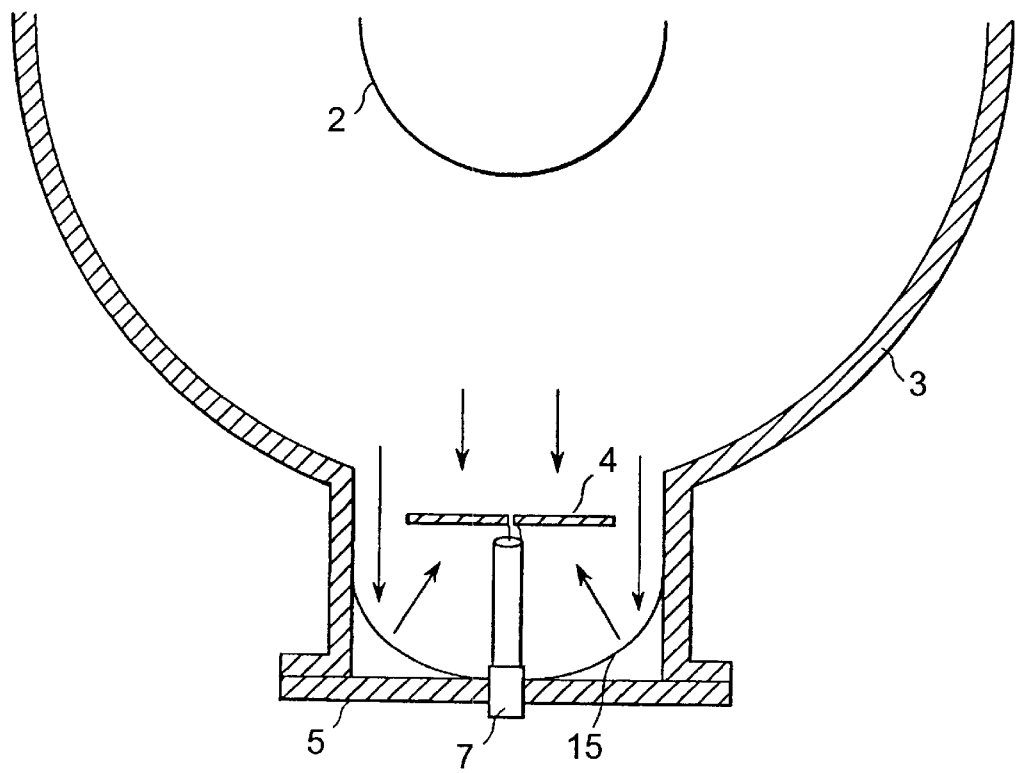
FIG. 8 is a vertical cross sectional view showing an example wherein a reflection plate is provided.
Figure 7:
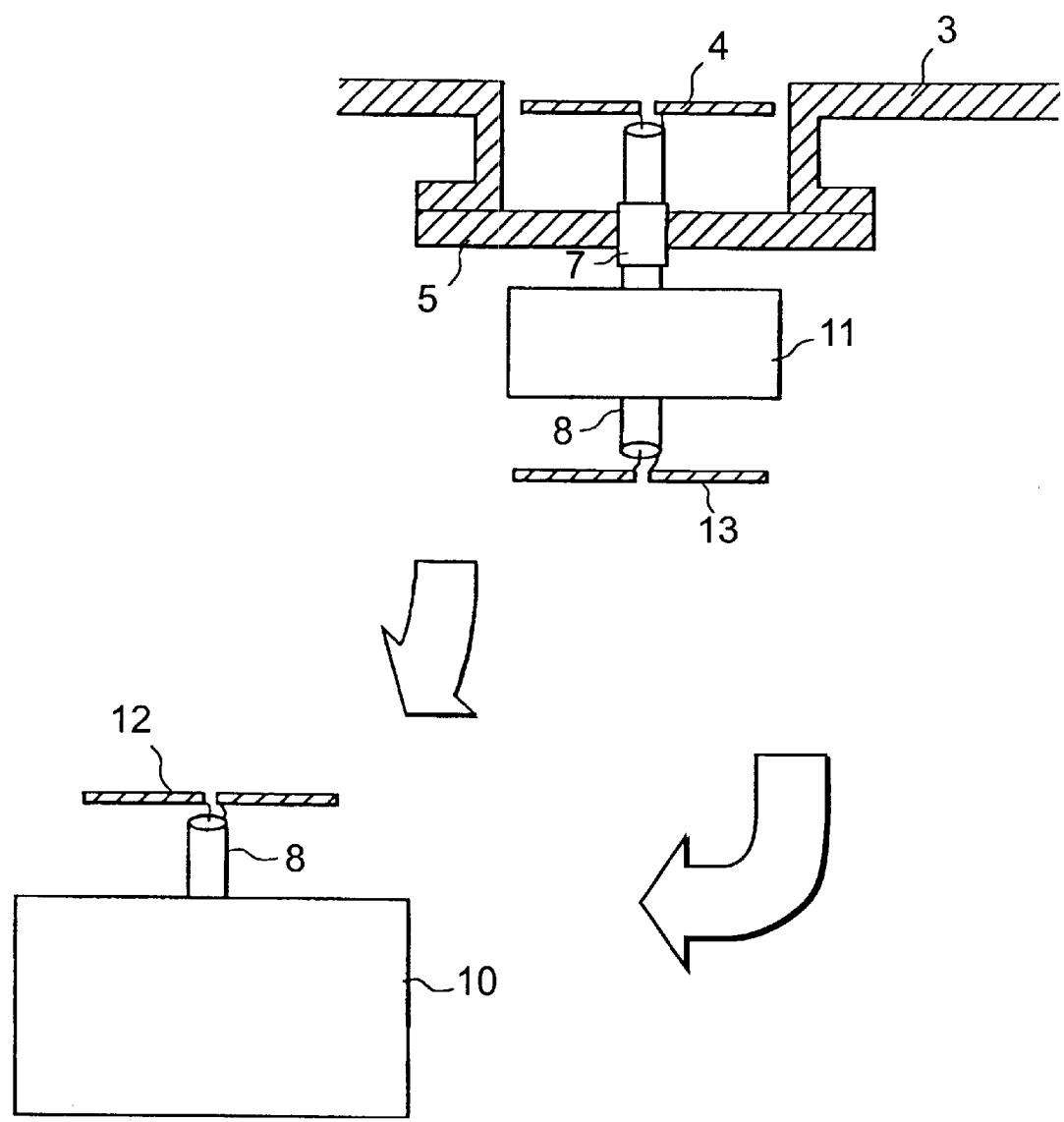
FIG. 7 is a partial cross sectional view showing another modification of FIG. 2.

Now, embodiments according to the present invention will be explained with reference to FIGS. 1 through 8, wherein FIG. 1 is a vertical cross sectional view showing a partial discharge detector for a gas insulated apparatus according to an embodiment of the present invention; FIG. 2 is a vertical cross sectional view showing an example which is applied for a potential measurement for the gas insulated apparatus; FIG. 3 is a vertical cross sectional view showing a modification of FIG. 2; FIG. 4 is a partial cross sectional view showing a modification of FIG. 1; FIG. 5 is a partial cross sectional view showing another modification of FIG. 1; FIG. 6 is a vertical cross sectional view showing a modification of a signal receiving antenna unit; FIG. 7 is a partial cross sectional view showing another modification of FIG. 2; and FIG. 8 is a vertical cross sectional view showing an example wherein a reflection plate is provided.

FIG. 1 shows an example in which a partial discharge detector according to the present embodiment is applied to one phase component for a gas insulated bus bar which is known as one of gas insulated apparatuses. A metallic vessel 3 formed in a tube shape is kept at the ground potential and within the metallic vessel 3 a high voltage conductor 2 is supported by an insulator supporting body 1. Further, in the metallic vessel 3, insulative gas having an excellent insulative property such as $SF_6$ gas is filled. At a barrel portion of the metallic vessel 3 a hand hole is provided, and within the hand hole a signal receiving antenna 4 is disposed. The hand hole is provided with a flange cover 5 for hermetically sealing the same. The signal receiving antenna 4 is constituted by combining and arranging two pieces of semicircular plates into a flat circular shape. The two pieces of semicircular plates are made of such as copper or aluminum serving as a good conductor and form conductive electrodes. The signal receiving antenna 4 is mounted on an antenna supporting stand 6 which is mounted on the flange cover 5 and disposed in the hand hole. Therefore, the signal receiving antenna 4 is secured through the insulator while electrically floated from the metallic vessel 3 serving as a grounded tank. At the center portion of the antenna supporting stand 6 a coaxial cable 8 having a small impedance variation is disposed and the two pieces of the semicircular plates constituting the signal receiving antenna 4 are respectively connected to a center core wire and an outer sheath wire of the coaxial cable terminal near its location and near the center portion of the circle to complete connection with the coaxial cable 8. The coaxial cable 8 in the metallic vessel 3 is connected to the coaxial cable 8 outside the metallic vessel 3 via a hermetically sealed coaxial terminal 7 provided at the flange cover 5 and is further connected to a measurement unit 10 via a coaxial connector.

In the thus constituted partial discharge detector for a gas insulated apparatus, when a partial discharge occurs in the metallic vessel 3, current pulses having high frequencies reaching up to several GHz are induced, and electromagnetic waves caused thereby propagate within the metallic vessel 3. When the propagating electromagnetic waves are received by the signal receiving antenna 4, a voltage is induced at the signal receiving antenna 4. The induced voltage is taken out from the metallic vessel 3 via the hermetically sealed terminal 7 attached to the flange cover 5 and is transmitted to the measurement unit 10 via the coaxial cable 8. The structure of the signal receiving antenna 4 serving as a detector is configurated in a circular shape by combining the two pieces of semicircular plates, which corresponds to one having increased area of a signal receiving unit in a dipole antenna, and which increases electrostatic capacitance between the high voltage conductor 2, and the ground to thereby permit potential measurement in the gas insulated apparatus. Further, with the use of the structure in which signals from the signal receiving antenna 4 are transmitted in a coaxial structure, received signals more than 100 MHz can be transmitted to the measurement unit 10 without attenuation, and measurement up to a high frequency band to the extent of several GHz can be realized. Still further, since the space in the metallic vessel 4 for accommodating the signal receiving antenna 4 is limited, through the use of such structured signal receiving antenna 4, signals expanding over a broad frequency band can be received even in a narrow space.

Further, since the signal receiving antenna 4 is used by grounding, the antenna can be used at the grounding potential without keeping the same as a floating electrode, therefore, troubles hardly occur even if the signal receiving antenna 4 is disposed inside the gas insulated apparatus.

As has been explained above, partial discharges can be detected with a high sensitivity for a broad frequency band, a highly accurate preventive maintenance can be achieved for a gas insulated apparatus as well as a detectable range of a single antenna within a gas insulated apparatus can be extended which unnecessitates to provide many number of antennas in the gas insulated apparatus and brings about an economical advantage.

FIGS. 2 and 3 show examples in which the present invention is applied for a potential measurement in a gas insulated apparatus. In the present embodiments no antenna supporting stand is used and the signal receiving antenna unit 4 is supported by a coaxial cylindrical tube. As illustrated in FIG. 2, an electrostatic capacitance C1 is formed between the signal receiving antenna unit 4 and the high voltage conductor 2, and another electrostatic capacitance C2 is formed between the signal receiving antenna unit 4 and the ground. The values of these capacitances C1 and C2 can be measured in advance and with the use of the signal receiving antenna unit 4 a potential through electrostatic division can be measured. With the measured potential, voltage of the high voltage conductor 2 can be measured through electrostatic division. When measuring potential through electrostatic division, the larger the electrostatic capacitance is, the higher the measuring sensitivity becomes. Since the signal receiving antenna unit 4 is structured as has been explained above, the present embodiment is suitable for a detector having a large area signal receiving portion.

Further, FIG. 3 shows an example which is structured to perform a potential measurement with further higher sensitivity. In the present embodiment, the center core wire and the outer sheath wire of the coaxial cable 8 located outside the metallic vessel 3 are connected each other, thereby a capacitor C3 is inserted between the center core wire and the ground. When determining the capacitance of the capacitor C3 to be sufficiently large in comparison with the capacitance C2, in that C2<<C3, a voltage measurement with a high sensitivity can be realized.

Now, when actually disposing the above explained semicircular plate antenna parts in a gas insulated apparatus, it is necessary to take into account of an insulation drop due to electric field concentration and the location thereof. In order to prevent such insulation drop due to electric field concentration under an influence of the antenna itself, the antenna is disposed in a portion showing a low electric field such as in a particle trap, absorbent pocket and a hand hole, as well as the following improvements are incorporated as shown in FIGS. 4 through 6.

FIG. 4 shows an example in which the outer circumferential edge portion of the semicircular plates forming the signal receiving antenna unit 4 is formed rounded. With such structure, an electric field concentration is prevented without reducing signal receiving sensitivity.

FIG. 5 shows another example in which a shield electrode 16 in a form of metallic cover is provided around the outer circumference of the antenna supporting stand 6, and the top end of the shield electrode 16 is formed bent toward the center side so as to cover a part of the outer circumference of the semicircular plates constituting the signal receiving antenna unit 4. With this structure, the electric field concentration is prevented.

FIG. 6 shows still another example in which the signal receiving antenna unit 4 is configured to match the inner face curvature of the cylindrical shaped metallic vessel 3 and is disposed inside the metallic vessel 3. In this instance, the signal receiving antenna unit 4 need not to be disposed in the [band] hand hole, it is only necessary to form a hole of which diameter is equal to the hermetical seal terminal 7 so that the flange cover 5 can be formed small. The signal receiving antenna unit 4 is constituted only by disposing two pieces of antenna parts at right and left of the hermetical seal terminal 7. In this instance, other than the semicircular antenna plates, a plate shaped antenna configured in a form of such as semielliptical shape and rectangular shape can be used. In this way, when the antenna is formed by bending in a curvature following the inner face of the metallic vessel 3, the antenna can be secured without providing a hand hole having a large diameter which permits insertion of the antenna. Further, the insulation drop due to the electric field concentration can be prevented without reducing signal receiving sensitivity.

FIG. 7 shows an example suitable for measurement of partial discharge signals from a remote place from a gas insulated apparatus in which a signal transmitting circuit 11 incorporating an impedance matching circuit and an amplifier is provided for transmitting the signals received at the signal receiving antenna unit 4 in the metallic vessel 3. At the top end side of the coaxial cable connected to the signal transmitting circuit 11 a signal transmitting antenna 13 is provided. The measurement unit 10 is provided at a place remote from the metallic vessel 3 and a signal receiving antenna 12 is provided via a coaxial cable 8 at the measurement unit 10. The partial discharge signals detected by the signal receiving antenna unit 4 are impedance-matched and amplified at the signal transmitting circuit 11 and are transmitted from the signal transmitting antenna 13 in a form of electromagnetic waves. The signals transmitted from the signal transmitting antenna 13 are received by the signal receiving antenna 12 located at a place remote from the gas insulated apparatus and are measured by the measuring unit 10. In this embodiment, when an antenna having a high directivity as the signal receiving antenna 12, it can be determined only with a single signal receiving antenna 12 that at which portion among many number of partial discharge detectors mounted in respective portions in the gas insulated apparatus the partial discharge is occurring.

FIG. 8 shows an example which further enhances the detection sensitivity of the signal receiving antenna unit 4. Between the signal receiving antenna unit 4 and the flange cover 5 a semispherical reflection plate 15 is disposed and the reflection plate 15 is formed in a size substantially the same as the inner diameter of the hand hole. With the structure thus constituted, if electromagnetic waves propagating through the gas insulated apparatus are passed without being caught by the signal receiving antenna unit 4, the once passed electromagnetic waves are reflected with no leakage by the reflection plate 15 toward the signal receiving antenna unit 4. As a result, the electromagnetic waves which can not be caught at the front face of the signal receiving antenna unit 4 are effectively collected which possibly enhances signal receiving sensitivity.

INDUSTRIAL FEASIBILITY OF THE INVENTION

As has been explained hitherto, with the partial discharge detector for a gas insulated apparatus according to the present invention, partial discharge signals in the gas insulated apparatus can be detected with a high sensitivity for a board frequency band. Further, potential measurement in the gas insulated apparatus can be performed through electrostatic capacitance division with respect to ground. Still further, with the provision of a signal receiving antenna unit an electric field concentration within the gas insulated apparatus is prevented and electromagnetic waves induced by a partial discharge can be detected with a high sensitivity for a broad frequency band which is equal to or more than that of a dipole antenna.

What is claimed is:

1. A partial discharge detector for a gas insulated apparatus having a metallic vessel, which is filled with insulation gas and accommodates therein a high voltage conductor supported by insulating members, comprising;

a signal receiving antenna unit formed by disposing two pieces of plate shaped conductive electrodes arranged on a common plane with a gap in a symmetric manner with respect to the gap and forming a dipole antenna in combination;

a coaxial cable coupled with said signal receiving antenna unit and electrically extending outside the metallic vessel through a hermetically sealing coaxial terminal;

a measuring unit coupled with said coaxial cable; and wherein a center core wire and an outer grounding wire of said coaxial cable are directly connected to either one of the two plate shaped conductive electrodes at the center portion of the two pieces of the plate shaped conductive electrodes, and said measuring unit is coupled with said coaxial cable through a coaxial connector.

2. The partial discharge detector for a gas insulated apparatus according to claim 1, wherein each of the two plate shaped conductive electrodes is shaped in a semicircular form and said signal receiving antenna unit is disposed in a low electric field intensity portion provided in the gas insulated apparatus including a hand hole.

3. The partial discharge detector for a gas insulated apparatus according to claim 1, wherein a capacitor is coupled between a signal line from the signal receiving antenna unit to be ground.

4. The partial discharge detector for a gas insulated apparatus according to claim 1, wherein each of the two plate shaped conductive electrode is configured to follow along the inner surface of the metallic vessel.

5. The partial discharge detector for a gas insulated apparatus according to claim 1, wherein an outer circumferential edge portion of each plate shaped conductive electrode is formed rounded.

6. The partial discharge detector for a gas insulated apparatus according to claim 1, wherein a shield electrode is provided to cover an outer circumference of each plate shaped conductive electrode.

7. The partial discharge detector for a gas insulated apparatus according to claim 1, wherein said signal receiving antenna unit is grounded.

8. The partial discharge detector for a gas insulated apparatus according to claim 1, wherein said signal receiving antenna unit is supported via an insulating member by the metallic vessel.

9. The partial discharge detector for a gas insulated apparatus according to claim 1, further comprising:

a transmitting circuit coupled with said coaxial cable, which includes an impedance matching circuit and an amplifier;

a signal transmitting antenna coupled with said coaxial cable; and a signal receiving antenna coupled with said measuring unit for receiving electromagnetic waves transmitted from said signal transmitting antenna.

10. The partial discharge detector for a gas insulated apparatus according to claim 1, further comprising:

a semispherical shaped plate for concentrating electromagnetic waves to said signal receiving antenna unit through reflection and disposed between said signal receiving antenna unit and a flange cover attached to an opening of a hand hole provided on the metallic vessel.

11. The partial discharge detector according to claim 9, wherein a plurality of the signal transmitting antennas are provided in various parts of said gas insulated apparatus and a single signal receiving antenna is provided at said measurement unit.

* * * * *